United States Patent [19]

Hush et al.

[11] Patent Number: 4,891,794
[45] Date of Patent: Jan. 2, 1990

[54] THREE PORT RANDOM ACCESS MEMORY

[75] Inventors: Glen E. Hush; Jeffrey S. Mailloux; Eugene H. Cloud, all of Boise, Id.

[73] Assignee: Micron Technology, Inc., Boise, Id.

[21] Appl. No.: 208,676

[22] Filed: Jun. 20, 1988

[51] Int. Cl.[4] .................. G11C 7/00; G11C 11/40; G11C 8/00

[52] U.S. Cl. .................. 365/189.04; 365/230.09; 365/221; 365/239; 365/230.05

[58] Field of Search ............ 365/189, 230, 239, 240, 365/230.03, 230.05, 230.09, 189.04, 221

[56] References Cited

U.S. PATENT DOCUMENTS

| | | | |
|---|---|---|---|
| 4,120,048 | 10/1978 | Fuhrman | 365/230.09 X |
| 4,646,270 | 2/1987 | Voss | 365/230.09 X |
| 4,648,077 | 3/1987 | Pinkham et al. | 365/240 |
| 4,747,081 | 5/1988 | Heilveil et al. | 365/240 |
| 4,794,566 | 12/1988 | Richards et al. | 365/230.09 X |

Primary Examiner—Stuart N. Hecker
Assistant Examiner—Alyssa H. Bowler
Attorney, Agent, or Firm—Stan Protigal; Angus Fox; Jon Busack

[57] ABSTRACT

A three port memory device has two serial ports and a random access memory port. The random access memory port is addressed to a random access memory in a conventional manner, using RAS and CAS address signals. Data may also be supplied and retrieved through two serial ports to a pair of serial access memories for transfer between the serial ports and the random access memory. This configuration permits formatted data to be simultaneously assessed through the two serial ports, while the random access memory port is being accessed.

20 Claims, 3 Drawing Sheets

THREE PORT RANDOM ACCESS MEMORY

FIELD OF THE INVENTION

This invention relates to semiconductor memory devices and more particularly to address ports for random access memories.

BACKGROUND OF THE INVENTION

A video RAM (VRAM), sometimes called dual-port RAM, is a DRAM (dynamic random access memory) with a serial access memory. The serial access memory permits a block of stored data to be rapidly accessed, while the normal access function of the DRAM is also occurring. The information in the serial access memory is normally obtained from, or input into, a primary memory on the VRAM. The primary memory is configured as a DRAM and is accessed according to DRAM protocols.

Information may be put into the VRAM at DRAM address speeds and output through the serial access port, or vice-versa. This is convenient for video applications because some address sequences, such as pixels in a raster scan, are predetermined.

The VRAM permits both serial access memory input and serial access memory retrieval of the access memory, but not simultaneously. Therefore, if both input and retrieval are to be accomplished, a logic protocol must be established. It would be desirable to permit simultaneous storage to and retrieval from a memory while also permitting random access to a main memory.

SUMMARY OF THE INVENTION

The present invention contemplates a triple port DRAM, which is an extension of the dual port DRAM (video RAM or VRAM). It consists of a large DRAM-based random access memory and two long, independent serial access memories (SAMs). Data can be transferred, in specified blocks, bi-directionally between the DRAM and either of the SAM registers. All three of the ports can be operated independently and asynchronously of the others except when an internal transfer is taking place.

The addition of another serial port would have advantages in the areas of image acquisition (frame grabbers) and high speed networking controllers/buffers. Many of these designs currently use dual port DRAMs and must switch the direction of the serial port to either input or output bit streams. For instance, the present variety of "frame grabber" video boards can acquire images in real-time and then manipulate the image data (filtering, edge detection, etc.) or add computer generated information to the captured image (text overlay, windows, etc.). The composite image can then be output for display. Since these boards need to switch the video RAMs from input to output, they can not be doing all three operations simultaneously in real-time. By adding the third port, we would allow the designers to acquire (serial input), display (serial output), and manipulate (random access) the same data at the same time.

DETAILED DESCRIPTION OF THE PREFERRED EMBODIMENTS

Figure 1:
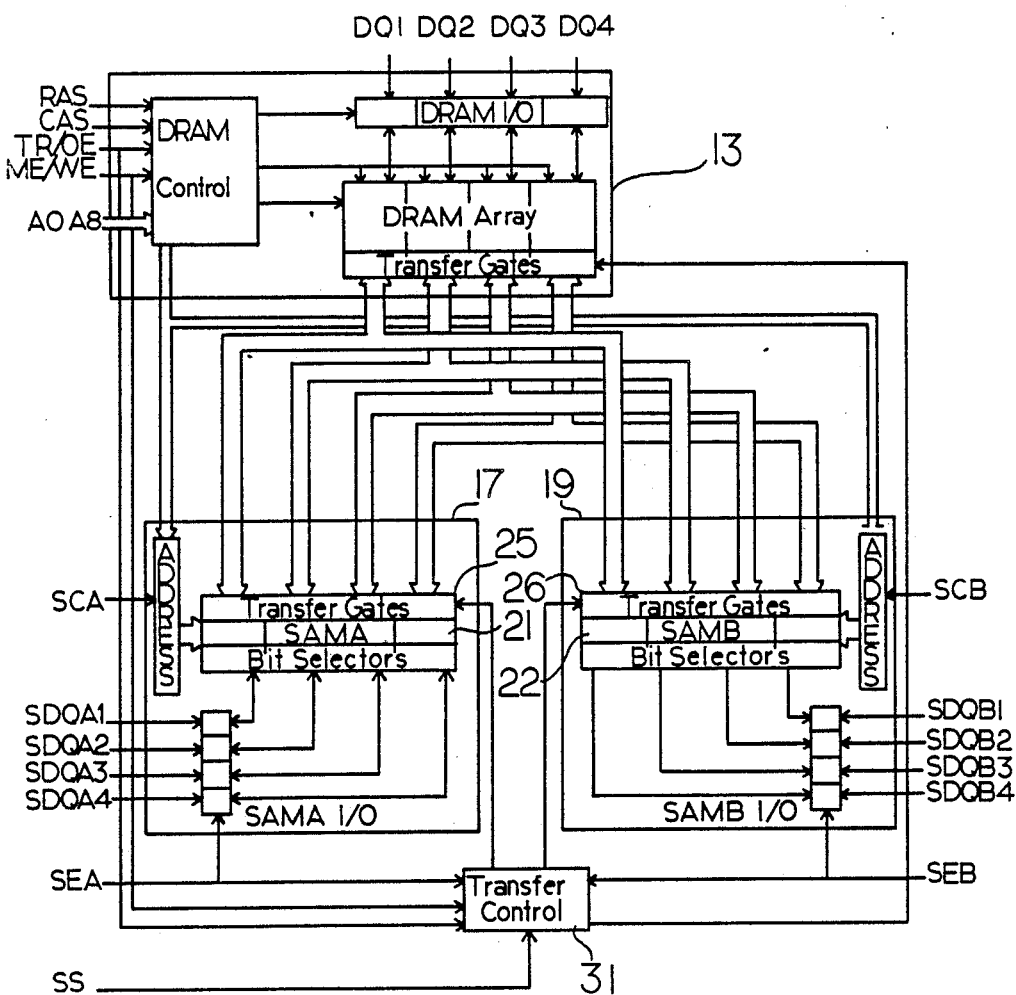
FIG. 1 is a block diagram showing the function of a preferred embodiment of the invention.

FIG. 1 shows the configuration of a triple port DRAM (TPDRAM) which is based on a 1 Meg DRAM (Dynamic Random Access Memory). In one preferred embodiment, this includes a high speed, triple port CMOS dynamic random access memory containing 1,048,576 bits of random access memory 13. The 4096 bits of serial access memory (SAM) 17, 19 are organized as two blocks of 512×4 bits each. Data can be transferred, in blocks of 2048 bits each, bi-directionally between the DRAM 13 and either of the SAM registers 17 or 19. All three of the ports 13, 17, 19 can be operated asynchronously and independently of the others except when an internal data transfer is taking place.

The DRAM portion 13 of the TPDRAM is functionally the same as a MT4C4256 256K×4 DRAM sold by Micron Technology, Inc., of Boise, Id., the assignee of this invention. Any four bits of the DRAM portion 13 can be accessed by providing the proper ROW and COLUMN addresses. Fast page or static column access cycles are available.

The SAM portions 17, 19 of the TPDRAM are two identical, yet completely independent, 512×4 bit data registers 21, 22 and two serial I/O ports 25, 26. The two SAM I/O ports 25, 26 have independent clock (SC.A and SC.B) and enable (SE.A and SE.B) inputs. Each port may be configured for serial data input or serial data output.

A 2048 bit wide internal data bus makes it possible to transfer four complete ROWs of DRAM data between the DRAM portion 13 and the SAM registers 21, 22. This transfer takes no longer than a normal DRAM access cycle and can be transparent to the serial input or serial output data streams. Either SAM 17 or 19 can transfer data to any DRAM ROW and any DRAM ROW can be transferred to either SAM 17 or 19. The transfer cycle is the only time when the DRAM timing (of the DRAM portion 13) must be partially synchronized with the SAM timing.

A transfer operation is initiated when a transfer enable signal TR/OE is LOW prior to or at RAS going LOW. A directional control signal, ME/WE, indicates the direction of the transfer and must be HIGH as RAS goes LOW for a DRAM-TO-SAM 17 or 19 transfer. SS, a SAM select signal is used, when RAS goes LOW, to indicate which SAM (17 or 19) is being accessed during the transfer cycle. In the case of a 1Meg TPDRAM, the row address bits indicate four 512 bit DRAM rows (2048 bits) that are to be transferred to the four SAM data registers and the column address bits indicate the start address of the next SERIAL OUTPUT cycle from the SAM data registers. RAS and CAS are used to strobe the address bits into the part. To complete the transfer, TR/OE is taken HIGH while RAS and CAS are still LOW. The 2048 bits of DRAM data are then written into SAM data registers of the selected SAM 17 or 19 and the serial shift start address is stored in an internal 8 bit register. There must be no rising edges on the serial clock input SC, A or SC.B while the transfer is taking place. Transfer cycles are the only time when SC must be synchronized with the DRAM RAS and CAS timing. An asynchronous transfer capability (for example the split WRITE transfer, which is available on 1 Meg Video RAMs) may be added as an option. If SE is LOW, the first bits of the new row data will appear at the serial outputs with the next SC clock pulse. SE enables the serial outputs and may be either HIGH or LOW during this operation.

The SAM-TO-DRAM transfer operation is identical to the DRAM-TO-SAM transfer described above except that ME/WE and SE must be LOW when RAS goes LOW. When RAS goes LOW, SS indicates which SAM the data is being transferred from. The ROW address indicates the DRAM row that the SAM data registers will be written to and the column address indicates the starting address of the next SERIAL INPUT cycle for the SAM data registers. If SE is HIGH when RAS goes LOW, a SERIAL INPUT MODE ENABLE cycle is performed.

As with all DRAMs, the DRAM portion 13 of the TPDRAM 11 must be refreshed in order to maintain data. The refresh cycles must be timed so that all 512 combinations of RAS addresses (A0-A8) are executed at least every 8 ms. A DRAM ROW will be refreshed by any of the following operations: DRAM READ, DRAM WRITE, RAS-ONLY refresh, CAS-BEFORE-RAS refresh, or INTERNAL TRANSFER. Both SAM registers 21, 22 are completely static and do not require any refresh.

A transfer control circuit 31 consists of the random logic required to direct and control the internal flow of data during Transfer cycles. This circuit selectively enables the proper transfer gates to perform the specified transfer cycles.

SE.A and SE.B act as I/O buffer controls and enable or disable the serial I/O buffers. They are also used by the TRANSFER control circuitry to indicate whether a SAM-TO-DRAM or serial input mode enable cycle is being performed.

Figure 2:
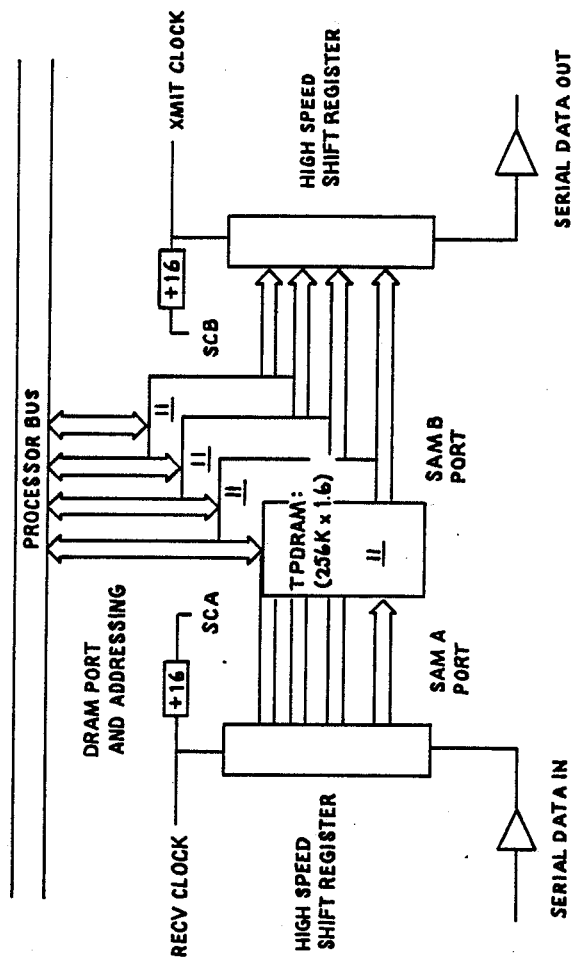
FIG. 2 schematically shows implementation of the inventive memory device in a communications system.

FIG. 2 shows a typical application of the inventive circuit, in which data is transferred through a series of TPDRAMs 11 in a high speed communications link. The TPDRAMs 11 allow for full-duplex operation with the received data and transmitted data residing in the same memory chip. This is especially useful where the message must be forwarded along the network or for repeaters. Some network controllers now use dual port DRAMs, which means that the serial port direction must be changed (and therefore the memory can not receive and transmit portions) or data must be passed from one memory chip to another.

Figure 3:
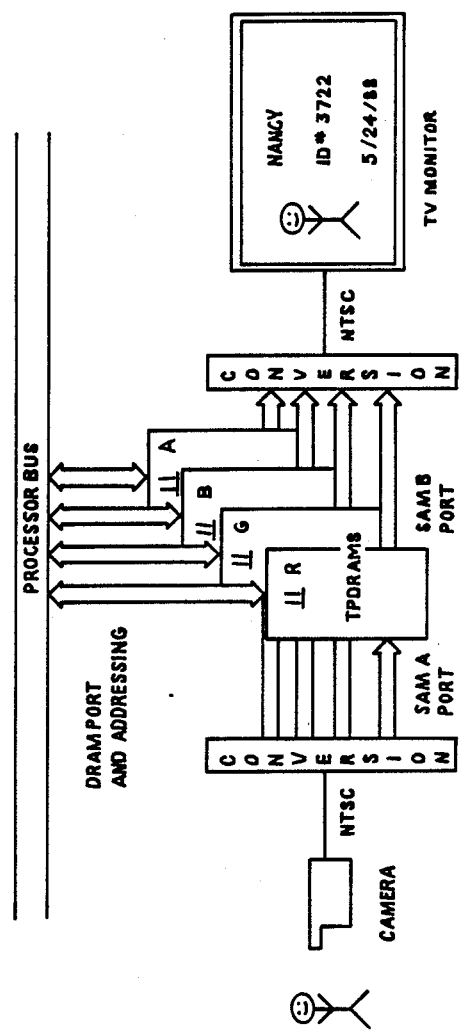
FIG. 3 shows the inventive memory device in a video imaging system.

FIG. 3 shows a series of TPDRAMs 11 used in video imaging systems Video input is taken from a camera, VCR, broadcast signal, or scanner; converted to a RGB or HSI representation and stored in the memory; and then manipulated or supplemented by an imaging process while the results are displayed on a monitor. Desktop publishing, video animation and special effects, inspection systems, robotics and automation, and tracking/targeting systems are some of the areas that might use products based on the TPDRAM.

DRAM portion 13 has been described as the randomly accessed memory portion of the inventive memory device. It is also possible to use other types of random access memories, such as a static RAM, in lieu of the DRAM portion 13. Video static RAMs (VSRAMs) are similar to VRAMs, except that, in the VSRAM, the primary memory is configured as a static RAM (SRAM).

What is claimed is:

1. Solid state memory device capable of receiving and transmitting data in a serial format and permitting random access to the data, characterized by:
   (a) a random access memory array containing a plurality of data bits;
   (b) a plurality of serial access memories;
   (c) transfer circuitry including a plurality of transfer gates communicating with the random access memory array, the transfer circuitry communicating between the transfer gates and the serial access memories in order to transfer data between the random access memory and the serial access memories;
   (d) the transfer circuitry transferring said data selectively to any one of said plurality of serial access memories;
   (e) the transfer circuitry including a transfer control circuit controlling with which serial access memory said transfer of data is performed; and
   (f) a serial address connection for at least two of the serial access memories.

2. Solid state memory device as described in claim 1, further characterized by:
   the random access memory array being addressable by external read commands and by external write commands.

3. Solid state memory device as described in claim 2, further characterized by:
   the serial address memories being static or dynamic memory circuits which are each addressed in at least one static sequence.

4. Solid state memory device as described in claim 3, further characterized by:
   the random access memory array being addressable by RAS and CAS address commands.

5. Solid state memory device as described in claim 4, further characterized by:
   (a) the memory device being incorporated onto a single portion of a semiconductor wafer; and
   (b) the random access memory array being a dynamic random access memory array.

6. Solid state memory device as described in claim 2, further characterized by:
   the transfer circuitry communicating between the transfer gates and the serial access memories in order to transfer data between the random access memory and any one of a plurality of the serial access memories;

7. Solid state memory device as described in claim 6, further characterized by:
   each serial access memory including a plurality of multiple bit memories, each of which plurality is separately addressable.

8. Solid state memory device as described in claim 2, further characterized by:
   the serial address memories being dynamic memory circuits which are each addressed in at least one sequence.

9. Solid state memory device as described in claim 1, further characterized by:
   each serial access memory including a plurality of multiple bit memories, each of which plurality is separately addressable.

10. Solid state memory device as described in claim 1, further characterized by:
    (a) the memory device being incorporated onto a single portion of a semiconductor wafer; and (b) the random access memory array being a dynamic random access memory array.

11. Solid state memory device as described in claim 1, further characterized by:
(a) the memory device being incorporated onto a single portion of a semiconductor wafer; and
(b) the random access memory array being a static random access memory array.

12. Solid state memory device as described in claim 1, further characterized by:
the serial address memories each being registers having like number of bits;
the serial address memories each having independent enable inputs;
the serial address memories each being responsive to a directional control signal; and
the transfer of said data being accomplished when a transfer enable signal and the directional control signal are applied to the serial address memory.

13. Solid state memory device capable of receiving and transmitting data in a serial format and permitting random access to the data, characterized by:
(a) a random access memory array containing a plurality of data bits,
(b) a plurality of serial access memories;
(c) the random access memory array being addressable by external read commands and by external write commands;
(d) the serial address memories being static memory circuits which are each addressed in at least one static sequence;
(e) a plurality of transfer gates communicating with the random access memory array and the serial access memories in order to transfer data between the random access memory and one of the serial access memories;
(f) the plurality of transfer gates transferring said data selectively to any one of said plurality of serial access memories; and
(g) a serial address connection for at least two of the serial access memories.

14. Solid state memory device as described in claim 13, further characterized by:
the random access memory array being addressable by RAS and CAS address commands.

15. Solid state memory device as described in claim 14, further characterized by:
(a) the memory device being incorporated onto a single portion of a semiconductor wafer; and
(b) the random access memory array being a dynamic random access memory array.

16. Solid state memory device as described in claim 13, further characterized by:
the serial address memories being dynamic memory circuits which are each addressed in at least one sequence.

17. Solid state memory device as described in claim 13, further characterized by:
(a) the memory device being incorporated onto a single portion of a semiconductor wafer; and
(b) the random access memory array being a dynamic random access memory array.

18. Solid state memory device as described in claim 13, further characterized by:
(a) the memory device being incorporated onto a single portion of a semiconductor wafer; and
(b) the random access memory array being a static random access memory array.

19. Solid state memory device as described in claim 13, further characterized by:
each serial access memory including a plurality of multiple bit memories, each of which plurality is separately addressable.

20. Solid state memory device as described in claim 13, further characterized by:
the serial address memories each being registers having like number of bits;
the serial address memories each having independent enable inputs;
the serial address memories each being responsive to a directional control signal; and
the transfer of said data being accomplished when a transfer enable signal and the directional control signal are applied to the serial address memory.

* * * * *